United States Patent
Koike et al.

(10) Patent No.: US 6,926,934 B2
(45) Date of Patent: Aug. 9, 2005

(54) METHOD AND APPARATUS FOR DEPOSITED FILM

(75) Inventors: Atsushi Koike, Kawasaki (JP); Yukito Aota, Yokohama (JP); Masahiro Kanai, Tokyo (JP); Hiroshi Sugai, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/818,640

(22) Filed: Mar. 28, 2001

(65) Prior Publication Data

US 2002/0009546 A1 Jan. 24, 2002

(30) Foreign Application Priority Data

Mar. 29, 2000 (JP) ........................................ 2000-091199

(51) Int. Cl.[7] .......................... H05H 1/02; C23C 16/00
(52) U.S. Cl. .................. 427/574; 427/570; 427/255.28
(58) Field of Search ........................ 427/255.28, 255.37, 427/574, 570, 255.27, 458, 569, 585, 588; 118/723 E, 723 R, 723 MP

(56) References Cited

U.S. PATENT DOCUMENTS

| | | | | |
|---|---|---|---|---|
| 4,361,472 A | * | 11/1982 | Morrison, Jr. ............ 204/192 R |
| 4,795,529 A | * | 1/1989 | Kawasaki et al. ........... 156/643 |
| 4,873,445 A | * | 10/1989 | Le Jeune ................. 250/432 R |
| 4,950,956 A | * | 8/1990 | Asamaki et al. ......... 315/111.21 |
| 5,563,075 A | * | 10/1996 | Saito et al. ................... 437/4 |
| 5,662,819 A | * | 9/1997 | Kadumura ................... 428/711 |
| 5,980,999 A | * | 11/1999 | Goto et al. .................. 427/572 |
| 6,106,678 A | * | 8/2000 | Shufflebotham et al. ...................... 204/192.32 |
| 6,162,709 A | * | 12/2000 | Raoux et al. ................ 438/513 |
| 6,214,162 B1 | * | 4/2001 | Koshimizu .................. 156/345 |
| 6,435,131 B1 | * | 8/2002 | Koizumi .............. 118/723 ME |
| 6,444,137 B1 | * | 9/2002 | Collins et al. ................. 216/79 |

FOREIGN PATENT DOCUMENTS

| | | | | |
|---|---|---|---|---|
| JP | 61283127 A | * | 12/1986 | ......... H01L/21/302 |
| WO | WO 9858100 A1 | * | 12/1998 | ............ C23C/16/50 |

* cited by examiner

Primary Examiner—Shrive P. Beck
Assistant Examiner—Eric B. Fuller
(74) Attorney, Agent, or Firm—Fitzpatrick, Cella, Harper & Scinto

(57) ABSTRACT

In a deposited-film formation method or apparatus according to the present invention, which comprises providing a discharge electrode in a vacuum vessel equipped with exhaust means, supplying a hydrogen gas and a raw material gas for forming a deposited film which contains at least an Si element, generating plasma from the material gas by supplying high frequency electric power to the discharge electrode, and forming a deposited film on a substrate in the vacuum vessel by plasma CVD, wherein an auxiliary electrode is arranged in plasma in the vacuum vessel, a periodically changing voltage is applied to the auxiliary electrode without causing a discharge to form a deposited film, whereby it is possible to form an amorphous-silicon-based deposited film having good quality and good uniformity over a large area at a high rate of film formation.

10 Claims, 4 Drawing Sheets

EXPERIMENT A

EXPERIMENT B

EXPERIMENT C

EXPERIMENT D

METHOD AND APPARATUS FOR DEPOSITED FILM

BACKGROUND OF THE INVENTION

1. Field of the Invention

The present invention relates to a method for forming a deposited film and an apparatus for forming a deposited film, specifically to a film formation method and film formation apparatus for forming a thin film semiconductor and a photovoltaic element by, for example, a plasma CVD method, and relates to a film formation method and a film formation apparatus for forming a semiconductor thin film of a photovoltaic element such as a solar cell, using amorphous silicon or an amorphous alloy. More specifically, the present invention relates to a film formation method and a film formation apparatus for forming an amorphous silicon-based deposited film with a good and uniform quality in a large area while maintaining a high rate of film formation.

2. Related Background Art

By using amorphous silicon produced by the plasma CVD method, a semiconductor device having a large area can be comparatively easily formed as compared with use of crystal silicon or polycrystal silicon. Therefore, many amorphous silicon films are used for semiconductor devices, each of which needs a large area, such as a solar cell, a photosensitive drum of a copying machine, an image sensor of a facsimile, and a thin-film transistor for a liquid crystal display.

Formation of an amorphous-silicon film is generally conducted by a plasma CVD method in which a raw material gas containing Si such as $SiH_4$ or $Si_2H_6$ is decomposed with a high frequency discharge to change the gas into a plasma state and form a film on a substrate placed in the plasma.

When forming an amorphous-silicon film in a large area by the plasma CVD method, a high frequency of RF frequency (near 13.56 MHz) has been generally used conventionally. However, in CVD apparatuses which each have been developed for attempting to correspond to a large area in response to requests from devices having enlarged substrates, a problem of "non-uniformity of film quality" which was in tolerance level in each conventional apparatus corresponding to a small area has become larger in recent years.

Moreover, since from a viewpoint of productivity improvement acceleration of a film formation rate has been also requested in connection with enlargement of a substrate, several methods described below have been performed.

Typical methods are:

(1) a method of increasing a flow rate of a raw material gas such as $SiH_4$ or $Si_2H_6$, (2) a method of increasing the electric power of a high frequency discharge, and (3) plasma CVD method using a VHF frequency (about 30 to 300 MHz), which attract attention as leading technology.

For example, it is reported in Amorphous Silicon Technology 1992 p. 15–26 (Materials Research Society Symposium Proceedings Volume 258) that, by making a discharge frequency into a VHF frequency from a 13.56 MHz RF, a film formation rate can be markedly increased, and the formation of a good deposited film can be attained at a high rate.

However, in large area film formation, although any one of the above-described methods is effective in a point of increasing a film formation rate, they are not effective in regard to the above-described uniformity of film quality, and in addition, have problems that they reduce the whole film quality and the like.

SUMMARY OF THE INVENTION

Then, an object of the present invention is to solve the above-described problems and to provide a deposited-film formation method and a deposited-film formation apparatus capable of forming an amorphous-silicon-based deposited film with good quality and good uniformity over a large area, at high speed.

The present invention is to provide a deposited-film formation methods and deposited-film formation apparatuses as shown in the following items (1) to (20).

(1) A deposited-film formation method comprising the steps of: providing a discharge electrode in a vacuum vessel equipped with exhaust means; supplying a hydrogen gas and a raw material gas for a deposited film which contains at least an Si element (hereafter, the raw material gas including the hydrogen gas is referred to as "material gas"); supplying high frequency electric power to the discharge electrode to generate plasma from the material gas; and forming a deposited film on a substrate in the vacuum vessel by plasma CVD, the deposited-film formation method is characterized in that an auxiliary electrode is arranged in the plasma in the vacuum vessel, a periodically changing voltage is applied to the auxiliary electrode without causing a discharge to form a deposited film.

(2) The deposited-film formation method according to the above-described item (1), which is characterized in that a voltage applied to the above-mentioned auxiliary electrode has the maximum amplitude of 80 V or less.

(3) The deposited-film formation method according to the above-described item (2), which is characterized in that the maximum amplitude of the above-described voltage is 20 V to 80 V.

(4) The deposited-film formation method according to the above-described item (2), which is characterized in that the maximum amplitude of the above-described voltage is 20 V to 60 V.

(5) The deposited-film formation method according to any one of the above-described items (1) to (4), which is characterized in that a voltage lower than the potential of plasma (plasma potential) from the above-described material gas is applied only in a certain period in at least one cycle of the periodically changing voltage when the periodically changing voltage is applied to the above-described auxiliary electrode.

(6) The deposited-film formation method according to any one of the above-described items (1) to (5), which is characterized in that one or more above-mentioned auxiliary electrodes are arranged at least in the flow direction of the above-mentioned material gas.

(7) The deposited-film formation method according to the above-described items (1) to (6), which is characterized in that a frequency of a high frequency electric power supplied to the above-mentioned discharge electrode is 10 kHz to 500 MHz.

(8) The deposited-film formation method according to any one of the above-described items (1) to (7), which is characterized in that a frequency of a high frequency electric power applied to the above-described auxiliary electrode is equal to or more than 100 kHz.

(9) The deposited-film formation method according to any one of the above-described items (1) to (8), which is characterized in that the above-mentioned auxiliary electrode is an edgeless and small electrode having a small area facing a substrate in the above-mentioned vacuum vessel.

(10) The deposited-film formation method according to any one of the above-described items (1) to (8), which is characterized in that the above-mentioned auxiliary electrode is formed from a round bar and the like which is made to be small diameter and is made of a high strength material such as a high melting metal.

(11) A deposited-film formation apparatus for forming a deposited film on a substrate in a vacuum vessel by plasma CVD, which comprises a vacuum vessel equipped with exhaust means, raw material gas supply means for supplying a raw material gas for forming a film and a discharge electrode for making plasma from the material gas, the raw material gas supply means and the discharge electrode being formed in the vacuum vessel, and electric power introduction means for applying high-frequency electric power from a high frequency power source to the discharge electrode, the deposited-film formation apparatus is characterized in that an auxiliary electrode is arranged between a substrate in the above-mentioned vacuum vessel and the above-mentioned discharge electrode provided with facing the substrate and that the apparatus further comprises voltage application means which enables the application of a periodically changing voltage without causing a discharge.

(12) The deposited-film formation apparatus according to the above-described item (11), which is characterized in that voltage application means for applying a voltage to the above-mentioned auxiliary electrode is formed so as to apply the voltage having a maximum amplitude of 80 V or less.

(13) The deposited-film formation apparatus according to the above-described item (12), which is characterized in that a maximum amplitude of the voltage is 20 V to 80 V.

(14) The deposited-film formation apparatus according to the above-described item (12), which is characterized in that a maximum amplitude of the voltage is 20 V to 60 V.

(15) The deposited-film formation apparatus according to any one of the above-described items (11) to (14), which is characterized in that voltage application means for applying a voltage to the auxiliary electrode is formed so as to apply the voltage lower than plasma potential from the above-described material gas, only in a certain period in at least one cycle of the periodically changing voltage.

(16) The deposited-film formation apparatus according to any one of the above-described items (11) to (15), which is characterized in that one or more above-mentioned auxiliary electrodes are arranged at least in the flow direction of the above-mentioned material gas.

(17) The deposited-film formation apparatus according to any one of the above-described items (11) to (16), which is characterized in that the high frequency power source for supplying high frequency electric power having a frequency of 10 KHz to 500 MHz to the discharge electrode.

(18) The deposited-film formation apparatus according to any one of the above-described items (11) to (17), which is characterized in that voltage application means for applying a voltage to the above-mentioned auxiliary electrode is formed so as to apply high frequency electric power having a frequency of 100 KHz or more.

(19) The deposited-film formation apparatus according to any one of the above-described items (11) to (18), which is characterized in that the above-mentioned auxiliary electrode is an edgeless and small electrode having a small area facing a substrate in the above-mentioned vacuum vessel.

(20) The deposited-film formation apparatus according to any one of the above-described items (11) to (18), which is characterized in that the above-mentioned auxiliary electrode is formed from a round bar having a small diameter or the like which is made of a high strength material such as a high melting metal.

DETAILED DESCRIPTION OF THE PREFERRED EMBODIMENTS

Figure 1:
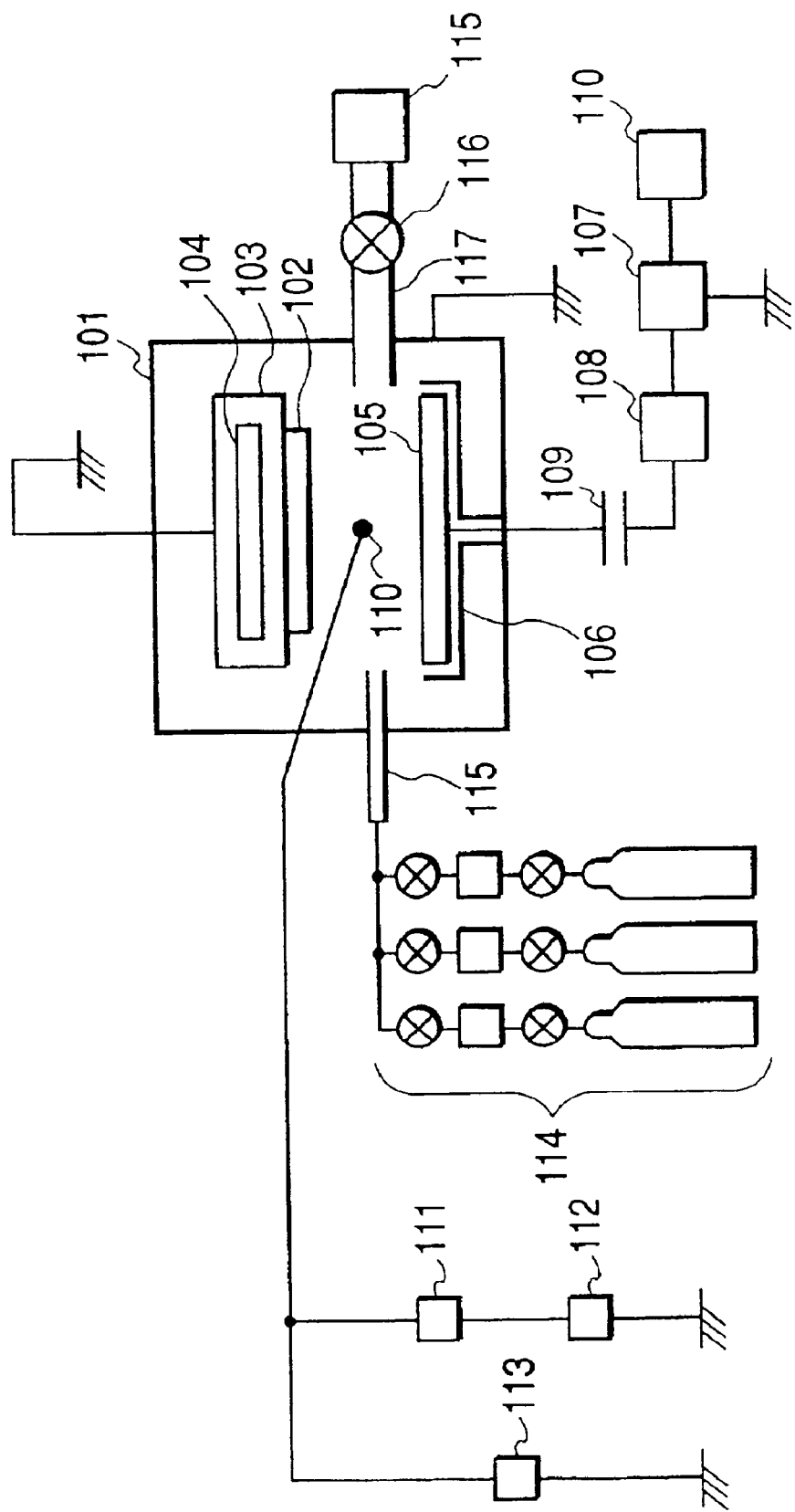
FIG. 1 is a schematic diagram showing an example of the constitution of a deposited-film formation apparatus that can perform a deposited-film formation method according to the present invention.

In embodiments of the present invention, it is possible to form an amorphous-silicon-based deposited film, having good quality and good uniformity over a large area at a high rate of film formation by applying the above-described constitution. This is on the basis of a fact that the present inventors found after performing various types of investigation. The fact is that these problems relating to film quality is the variation of a rate of hydrogen radical with respect to a precursor of a deposited film formed from a gas containing an Si element. In other words, it becomes possible to reduce the deterioration of uniformity of film quality and the degradation of film quality occurring over an entire surface when high-speed film formation is performed over a large area.

Next, these are described below in detail. First, in the above-described constitution, by arranging an auxiliary electrode in plasma in a vacuum vessel, and applying a periodically changing voltage to the auxiliary electrode without causing a discharge, and forming a deposited film, it becomes possible to accelerate an electron in plasma to about 16 eV (energy for giving a hydrogen molecular a maximum disassociation cross-sectional area) and to generate a hydrogen radical in high efficiency. At this time, the periodic change of electric potential is to prevent the regular formation of an ion sheath preventing the approach of electrons to the vicinity of the auxiliary electrode. This makes it possible to realize stable and effective acceleration of many electrons that electrons are returned in the vicinity of the electrode and expelled from the electrode radially (in the radial direction). Here, the gist of "without causing a discharge" is not to generate a discharge derived from electric power applied to the auxiliary electrode.

Nevertheless, when the maximum amplitude of the voltage applied exceeds 80 V, depending on a generation condition of plasma, discharge may occur in the maximum voltage. Here, it is important to form an electrical field without a discharge, and owing to this, it becomes possible to accelerate electrons to the energy "that can more effectively decompose hydrogen molecules". In other words, by not generating a discharge, it becomes possible to heat the electrode extremely little and to make current passing through the electrode extremely little. Since this allows a form of an electrode to be simple and slender in the field of temperature and current, it becomes possible not to leave a trace of the electrode in a deposited film on a substrate even when the electrode is arranged near the substrate.

In addition, by applying a voltage lower than the potential of plasma generated from the material gas only in a certain period at least in one cycle of the periodically changing voltage when the periodically changing voltage is applied to the auxiliary electrode, it becomes possible to effectively accelerate electrons in minimum voltage amplitude with little disturbing existing plasma.

As commonly known, when a voltage is applied with providing an electrode in plasma, when the voltage applied is higher than plasma potential, a sheath caused by electrons (electron sheath) is formed on an electrode surface, and when the voltage applied is lower than the plasma potential, a sheath caused by ions (ion sheath) is formed. Because these sheathes are density distributions of space charges, these sheathes are accompanied with an electrical field, and hence, if a potential difference voltages from plasma potential is equal to a field strength, when potential lower than the plasma potential is applied, this field strength becomes larger (this is based on mass difference between an electron and an ion). Thus, if it is intended to give electrons large energy by this electrical field, it is effective to apply an electric potential lower than the plasma potential to the electrode. Nevertheless, if all the electrons near the electrode are expelled due to application of this voltage (an ion sheath is formed), apparently, other electrons cannot approach the electrode because of the electric field after that, and hence energy impartation to electrons stops.

Therefore, here, this problem is solved by such periodic voltage application that electrons are returned to the vicinity of the electrode by returning the applied voltage nearly to the plasma potential, and again applying a voltage lower than the plasma potential.

Up to now, as disclosed in, for example, Japanese Patent Application Laid-Open No. 5-24992, and Japanese Patent Nos. 2819030 and 2819031, many attempts have been performed in which ion energy is controlled by a steady-state electric field (an electrical field that is near to a DC current-like electric field and hardly changes) generated by arranging an electrode in plasma and applying various types of electric power and electric potential. However, there has been no attempt like the present invention that a periodic electric field is applied as means for accelerating electrons that accelerates (imparting high energy) for generation of hydrogen radicals. The present invention is clearly different from conventional commonly known technology in the point of efficiently generating hydrogen radicals by imparting specific energy (to efficiently discompose only hydrogen) only to electrons in a high frequency electric field where ions cannot follow (energy is not given to ions).

Furthermore, by arranging a plurality of auxiliary electrodes at least in the flow direction of a raw material gas, it becomes possible to correct a concentration gradient that the quantity of hydrogen radicals in the plasma changes from the upstream of the gas to the downstream. It is considered that the concentration gradient of hydrogen radicals in this flow direction of the gas is caused by a lower electron temperature of general plasma than the dissociation energy of hydrogen molecules. In this case, because the material gas containing an Si element has dissociation energy equal to or less than the electron temperature, it is possible to make the concentration of precursors almost uniform over an entire region of plasma by adjusting a gas flow rate and discharge electric power.

Moreover, a frequency of high-frequency power applied to the discharge electrode is set preferably at 10 KHz to 500 MHz, and more preferably at 1 MHz to 200 MHz as a range of frequencies that can effectively decompose the material gas and can generate uniform plasma over a large area. In other words, the decomposition efficiency of the material gas is low in the frequency lower than about 10 KHz, and it is difficult to obtain uniform plasma over a large area because of difficult discharge by an electrode at a frequency higher than about 500 MHz.

In addition, as an waveform of the periodically changing voltage which is applied to the auxiliary electrode, an waveform such as a square wave or a trapezoidal wave is suitable because it is essential that a falling edge is sharp from the necessity of accelerating electrons during change of the voltage of the auxiliary electrode from nearly plasma potential to lower potential.

Furthermore, as for a frequency of the voltage applied to the auxiliary electrode at this time, its lower limit is set to be preferably 100 kHz or higher, and more preferably 1 MHz or higher so as not to induce unnecessary movement of ions (high energization).

On the other hand, its upper limit is set to be preferably 5 GHz or lower, and more preferably 500 MHz or lower since the upper limit is a trapping frequency of an electron or lower.

Moreover, the maximum amplitude of the voltage applied to the auxiliary electrode is set to be 80 V or lower. However, considering a fact that the maximum disassociation cross-sectional area of a hydrogen molecule is about 16 eV, and permeability of electric field into plasma and attenuation of a hydrogen molecule, the maximum amplitude of the voltage is set to be preferably 20 V to 80 V, and more preferably 20 V to 60 V.

In addition, in order to maximize the number of electrons to be accelerated, potential difference between the maximum value of the applied voltage and plasma potential is set to be preferably 20 V or less, and more preferably 5 V to 15 V.

Moreover, as a form of the auxiliary electrode herein, a round bar, a square bar, or a plate is conceivable. However, a form having an area that faces a substrate and is as small as possible, having no edge, and having a small volume hardly causes an abnormal discharge, turbulence of gas flow, radiation of heat from the auxiliary electrode, and the like. Hence, a suitable form is the round bar and the like having a diameter that is made to be as small as possible with using a high strength material such as a high melting metal.

Furthermore, the material gas is a gas including a compound that contains at least silicon atoms and can be gasified, or may contain a gas including a compound that contains germanium atoms and can be gasified, a compound that contain carbon atoms and can be gasified or the like, or a mixed gas of the above-described compounds.

Concretely, as the compound that contains silicon atoms and can be gasified, a chain or cyclic silane compounds are used. More concretely, the used compound includes gases or compounds that can be easily gasified, for example, $SiH_4$, $Si_2H_6$, $SFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SCl_4$, $(SiCl_2)_5$, $SiBr_4$, $(SiBr_2)_5$, $Si_2Cl_6$, $SiHCl_3$, $SiH_2Br_2$, $SiH_2Cl_2$, $Si_2Cl_3F_3$, and the like. Here, D denotes deuterium.

Concretely, the used compound that contains germanium atoms and can be easily gasified includes $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, $Ge_2D_6$, and the like.

Specifically, the used compound that contains carbon atoms and can be easily gasified includes $CH_4$, $CD_4$, $C_nH_{2n+2}$ (n is an integer), $C_2H_2$, $CO_2$, $CO$, and the like.

Furthermore, atoms belonging to Group III and Group V of the Periodic Table (hereinafter, referred to as "Group III atoms" and "Group V atoms", respectively) can be used as a material to be introduced into a p-type layer or an n-type layer in order to control valence electrons.

As for materials effectively used as the starting material for the introduction of Group III atoms, concretely, a material for the introduction of boron atoms includes boron hydride such as $B_2H_6$, $B_4H_{10}$, $B_5H_{11}$, $B_6H_{10}$, $B_6H_{12}$ and $B_6H_{14}$, and boron halide such as $BF_3$ and $BCl_3$. Besides, $AlCl_3$, $GaCl_3$, $InCl_3$ and $TiCl_3$ can be included, too. In particular, $B_2H_6$ and $BF_3$ are suitable.

As for materials effectively used as the starting material for the introduction of group V atoms, concretely, a material for the introduction of phosphorous atoms includes phosphorus hydride such as $PH_3$ and $P_2H_4$, and phosphorus halide such as $PH_4I$, $PF_3$, $PF_5$, $PCl_3$, $PC_5$, $PBr_3$, $PBr_5$, and $PI_3$. Besides, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$, can be included, too. In particular, $PH_3$ and $PF_3$ are suitable.

Furthermore, it may be performed to adequately dilute the above-described compound, which can be gasified, with a gas such as $H_2$, He, Ne, Ar, Xe, or Kr and introduce the mixture into a film formation chamber.

Moreover, it is possible to use various kinds of deposited-film formation apparatuses when a deposited-film formation method herein is executed. For example, an apparatus having the configuration shown in the schematic diagram of FIG. 1 can be used.

The apparatus shown in FIG. 1 has the configuration that a bar-shaped auxiliary electrode is arranged between a substrate and a discharge electrode facing the substrate, and a periodically changing voltage is applied to the auxiliary electrode.

In FIG. 1, an electroconductive substrate 102 is set on an electroconductive substrate holder 103 inside a vacuum vessel 101, and is electrically grounded together with the vacuum vessel. A heater 104 is provided in the substrate holder 103, and the substrate 102 is heated to a predetermined temperature. A plate-like discharge electrode 105 is provided in the position facing the substrate 102, and a guard electrode 106 is provided for the discharge electrode 105. A high frequency power source 107 is connected to the discharge electrode 105 through a matching circuit 108 and a blocking capacitor 109. A high frequency signal generator 112 is connected to the auxiliary electrode 110 through a power amplifier 111. Furthermore, in the vacuum vessel 101, a raw material gas introduction pipe 115 connected to raw material gas supply means 114 and an exhaust pipe 117 connected to evacuation means 116 are provided for the introduction and evacuation of the material gas. In addition, a valve 118 is provided in the exhaust pipe.

Hereinafter, examples of a formation method of an amorphous silicon-based deposited film by plasma CVD according to the present invention are described, but the present invention is never restricted by these examples.

EXAMPLE 1

In Example 1, a deposited-film formation apparatus having the configuration shown in FIG. 1 was used, and a periodically changing voltage was applied to the auxiliary electrode 110. In addition, variation of the generated quantity of hydrogen radical (H*) and SiH* near a substrate with respect to the maximum amplitude of the voltage was examined. Furthermore, this method was compared with a conventional deposited-film formation method that did not adopt an auxiliary electrode.

Hereinafter, according to production procedure, a production method will be described in detail.

(1) In the apparatus shown in FIG. 1, first of all, a 30-cm square and 0.15-mm-thick stainless steel substrate 102 (SUS430-BA) was set in the substrate holder 103 made of stainless steel so as to be grounded, and the vacuum vessel 101 was once vacuum-exhausted to 1 Pa or lower by the evacuation means 116.

(2) The internal pressure of the vacuum vessel 101 was maintained at 100 Pa by introducing 100 sccm of He gas from the gas supply means 114 through the gas introduction pipe 115 and adjusting the opening of the exhaust valve 118 while continuously vacuum-exhausting.

(3) In a condition of the above-described (2), the substrate 102 was heated at 300° C. for about 60 minutes by the heater 104 in the substrate holder 103. When the substrate 102 was heated fully and uniformly, the introduction of He gas was stopped while continuously heating, and the material gas from the gas supply means was changed to a mixed gas of $SiH_4$ and $H_2$. Setting conditions were 300 sccm of $SiH_4$ gas flow rate, 1200 sccm of $H_2$ gas flow rate, and 266 Pa of internal pressure in the vacuum vessel 101.

(4) The 40-MHz 500-W high-frequency power was supplied from the high frequency power source 107 to the discharge electrode 105, which is made of aluminum and faces the substrate 102 by 1.5 cm apart, through the matching circuit 108 and blocking capacitor 109. In addition, a stainless steel round bar (5 mm diameter, 35 cm long) was used for the auxiliary electrode, and was provided in the center between the discharge electrode and substrate, in parallel to them, and approximately orthogonally to gas flow.

Furthermore, a square wave having a frequency of 1 MHz and a duty ratio of 50% was applied so that its maximum voltage became lower by 5 V than plasma potential. By generating a glow discharge in the vacuum vessel 101 through supplying high-frequency power, and plasma-decomposing a raw material gas, an amorphous silicon film was deposited on the substrate 102.

In addition, the surface potential of the auxiliary electrode was measured with an oscilloscope 113. The quantity of hydrogen radicals near the substrate was measured by monitoring the luminescence at 656 nm in realtime with a plasma spectroscopy-measuring instrument.

Figure 2:
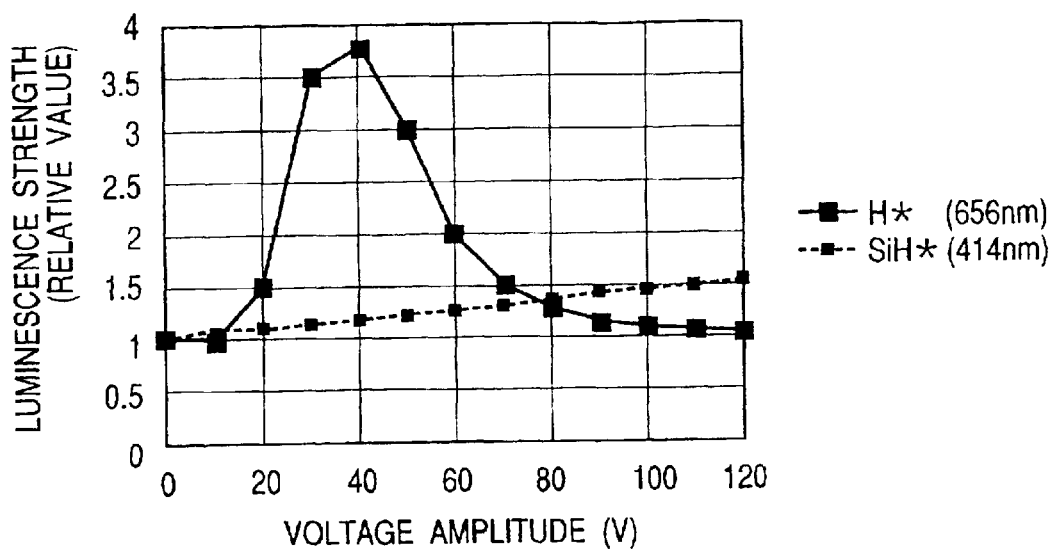
FIG. 2 is a graph showing the result of investigation about the luminescence strengths of hydrogen radical and SiH radical with respect to the voltage amplitude applied to an auxiliary electrode, according to Example 1 of the present invention.

FIG. 2 is a graph showing the result of investigation about the 656-nm luminescence strength showing the quantity of hydrogen radical (H*) and the 414-nm luminescence strength showing the quantity of SiH radical (SiH*) with respect to the voltage amplitude applied to the auxiliary electrode. FIG. 2 shows relative values obtained by regarding the luminescence strength of H* and SiH* without providing the auxiliary electrode as 1.

It can be seen from FIG. 2 that it is possible to control the quantity of H* without changing the quantity of SiH* by using a deposited-film formation method of the present example, that is, by setting the voltage amplitude to 80 V or less.

EXAMPLE 2

In Example 2, with using the same procedure as that in Example 1 except that a frequency of high-frequency power supplied to the discharge electrode was 60 MHz (besides, the following conditions are also different), variation of the generated quantity of hydrogen radical (H*) and SiH* near the substrate with respect to the maximum voltage amplitude was investigated. Furthermore, this method was compared with a conventional deposited-film formation method that did not adopt an auxiliary electrode.

Different conditions:

Material gas: $SiH_4$: 300 sccm, $H_2$: 600 sccm

Pressure: 133 Pa

Figure 3:
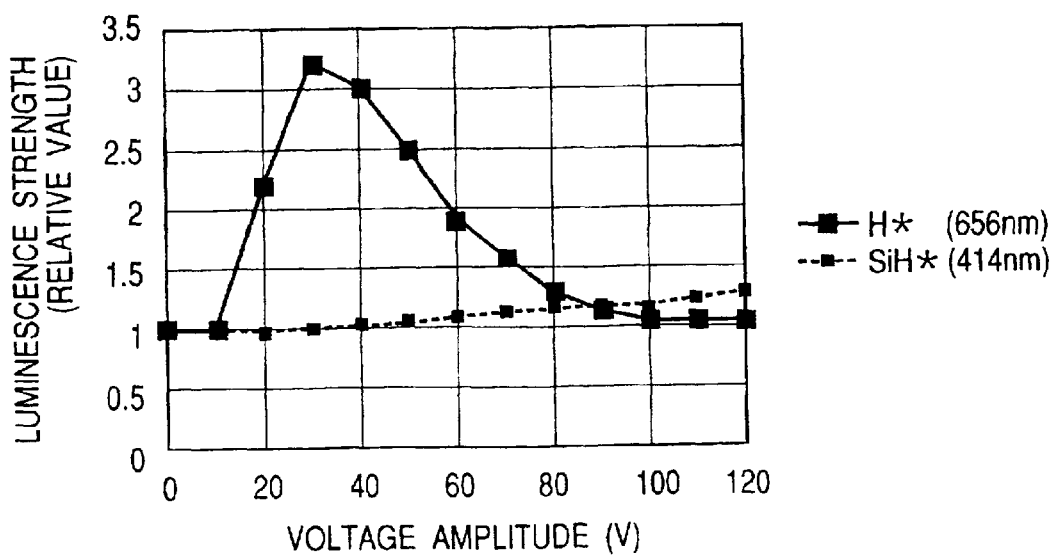
FIG. 3 is a graph showing the result of investigation about the luminescence strengths of hydrogen radical and SiH radical with respect to the voltage amplitude applied to an auxiliary electrode, according to Example 2 of the present invention.

FIG. 3 is a graph showing the result of investigation about the 656-nm luminescence strength showing the quantity of hydrogen radical (H*) and the 414-nm luminescence strength showing the quantity of SiH radical with respect to the voltage amplitude applied to the auxiliary electrode. FIG. 3 also shows relative values obtained by regarding the luminescence strength of H* and SiH* without providing the auxiliary electrode as 1.

It can be seen from FIG. 3 that it is possible to control the quantity of H* without changing the quantity of SiH* by using a deposited-film formation method of the present example, that is, by setting the voltage amplitude to 80 V or less.

EXAMPLE 3

Figure 4:
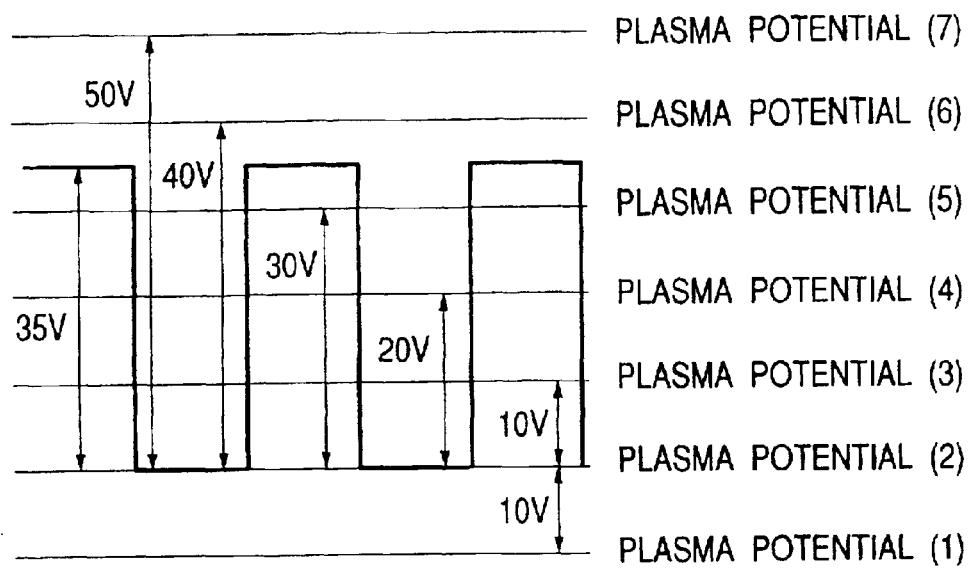
FIG. 4 is a chart showing the relation between the plasma potential and the amplitude of the voltage applied to an auxiliary electrode, according to Example 3 of the present invention.

In Example 3, with using the same conditions and procedure as those in Example 1, by changing the potential difference between the plasma potential and a square wave (frequency: 1 MHz, duty ratio: 50%, voltage amplitude: 35 V) applied to the auxiliary electrode (plasma potential–minimum potential: FIG. 4), variation of the generated quantity of hydrogen radical (H*) and SiH* near the substrate was investigated.

Figure 5:
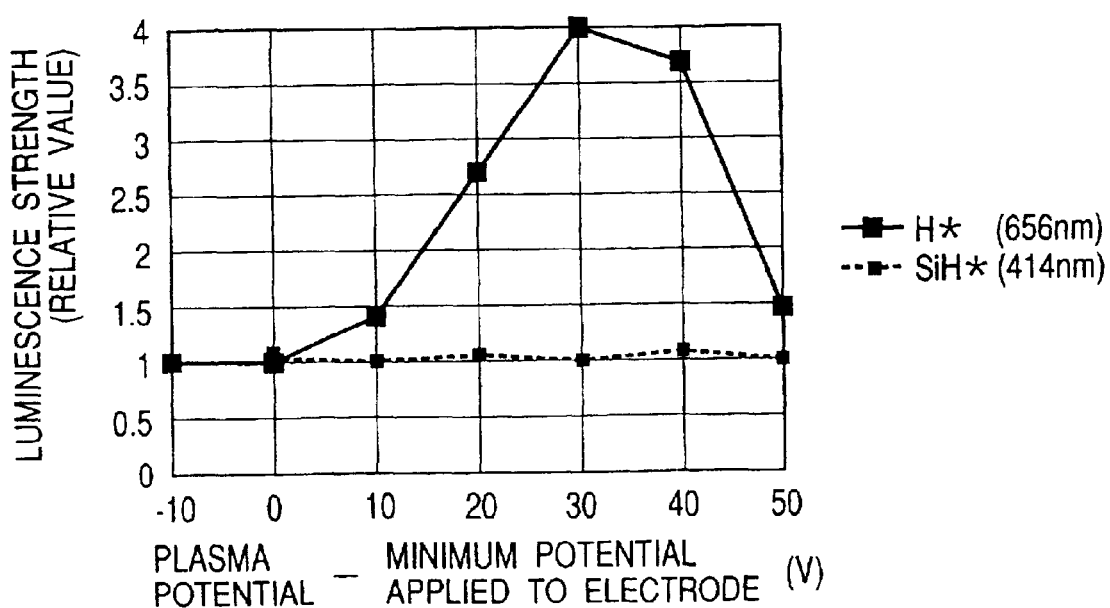
FIG. 5 is a graph showing the result of investigation about the luminescence strengths of hydrogen radical and SiH radical with respect to the potential difference between a square wave and plasma potential, according to Example 3 of the present invention.

FIG. 5 is a graph showing the result of investigation about the 656-nm luminescence strength showing the quantity of hydrogen radical (H*) and the 414-nm luminescence strength showing the quantity of SiH radical (SiH*) with respect to the potential difference between the square wave and the plasma potential (plasma potential—minimum potential). FIG. 5 also shows relative values obtained by regarding the luminescence strength of H* and SiH* without providing the auxiliary electrode as 1.

It can be seen from FIG. 5 that it is possible to effectively generate H* without changing the quantity of SiH* by using a deposited-film formation method of the present example, that is, by setting the voltage applied to the auxiliary electrode to a voltage lower than the potential of plasma derived from the material gas, in at least one certain period of one cycle.

EXAMPLE 4

In Example 4, with using a deposited-film formation apparatus having the configuration shown in FIG. 1, a semiconductor film for a photovoltaic device which has n-, i-, and p-type semiconductor layers (hereinafter, referred to as "n, i, and p layers") stacked by depositing amorphous silicon film on a stainless steel substrate in the same manners as those in Example 1. Formation conditions of each layer of a photovoltaic device (n, i, and p layers) are shown in Table 1. Furthermore, between formation processing of respective layers, the vacuum vessel had been fully evacuated once, and thereafter was purged several times with a He gas.

After n, i, and p layers had been deposited under formation conditions shown in Table 1, the substrate on which a deposited film was formed was taken out from the apparatus after cooling, and a 70-nm-thick ITO transparent conductive film was vapor-deposited on the entire surface of the deposited-film by a known vacuum deposition apparatus. Moreover, on the ITO film, a 0.1-mm-thick Ag collector electrode having 0.1-mm-wide comb teeth pattern in 3-mm intervals are provided by screen-printing of a silver paste, and 100 photovoltaic devices each having a size of about 30 mm square were formed. In addition, the photoelectric conversion efficiency of 100 photovoltaic devices formed was measured. Photoelectric conversion efficiency was obtained as an average of 10 samples that were orthogonal to a direction of gas flow at each of 10 points (samples) in the gas flow direction. Variation in the gas flow direction was defined as (maximum value−minimum value)/(maximum value+minimum value).

Figure 6:
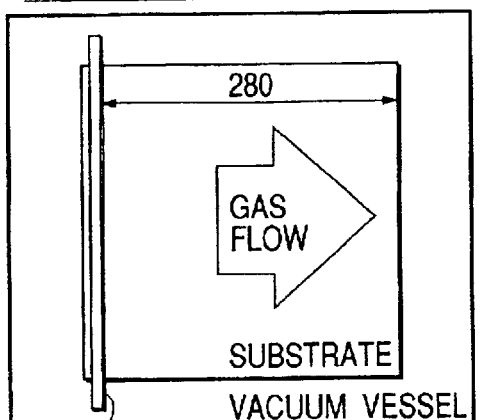
FIG. 6 is a schematic diagram showing locations of an auxiliary electrode against a substrate, according to Example 4 of the present invention.
Figure 6:
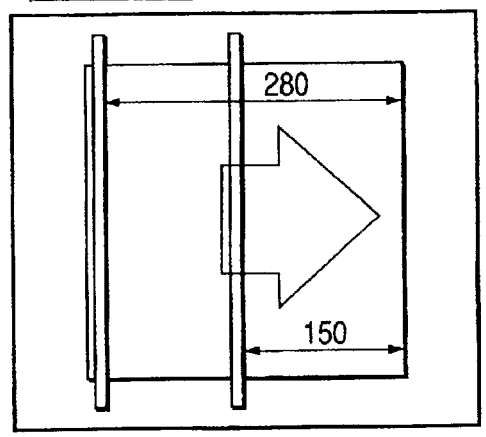
Figure 6:
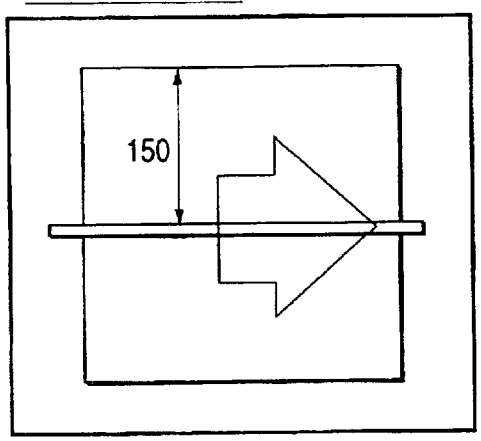
Figure 6:
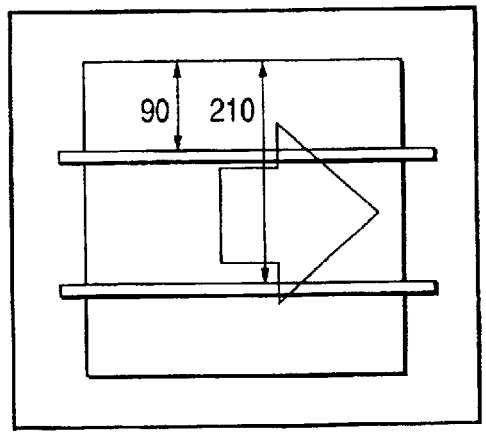

Locations of auxiliary electrodes for the substrate are shown in FIG. 6. Variation in the flow direction on each of these four auxiliary electrode-setting experiments was obtained. The result was shown in Table 2 as a ratio ((presence of auxiliary electrode)/(absence of auxiliary electrode)) against the variation (obtained with similar procedure) in the flow direction in case of not providing the auxiliary electrode. Moreover, in regard to each of the above-described four examples, the average of photoelectric conversion efficiencies and film formation rates of 100 samples is obtained. The results are also shown in Table 2 as each ratio ((presence of auxiliary electrode)/(absence of auxiliary electrode)) of the averages of the photoelectric conversion efficiencies and film formation rates in the case of providing the auxiliary electrode with respect to the case of not providing the auxiliary electrode.

It can be seen from Table 2 that, with the deposited-film formation method according to the present example, that is, by arranging a plurality of auxiliary electrodes at least in the flow direction of the material gas, it becomes possible to realize the uniformity of characteristics of a deposited film in the gas flow direction without causing the degradation of film quality in the entire surface of the deposited-film while maintaining a high rate of film formation.

As described above, according to the present invention, it is possible to form the amorphous-silicon-based deposited film having good quality and good uniformity over a large area at a high rate of film formation.

TABLE 1

| Name of deposited film | n layer | i layer | p layer |
|---|---|---|---|
| Conductivity type and crystal form | n-type | i-type | p-type |
| film thickness (nm) | a-Si: 30 | a-Si: 300 | a-Si: 10 |
| Flow rate (sccm) of material gas | | | |
| $SiH_4$ | 300 | 500 | 10 |
| $H_2$ | 1000 | 1000 | 3000 |

TABLE 1-continued

| Name of deposited film | n layer | i layer | p layer |
|---|---|---|---|
| $PH_3$ | 1 | None | None |
| $BF_3$ | None | None | 0.1 |
| Pressure (Pa) | 133 | 133 | 133 |
| Substrate heating temperature (C. °) | 300 | 300 | 300 |
| High-frequency power (W) | 500 | 500 | 1200 |
| Frequency (Hz) | 60 | 60 | 60 |
| Potential applied to auxiliary electrode | | | |
| Waveform and duty (%) | Square waveform: 50 | Square waveform: 50 | Square waveform: 50 |
| Frequency (MHz) | 1 | 1 | 1 |
| Voltage amplitude (V) | 35 | 35 | 35 |
| Potential difference between plasma potential (Vp) and maximum voltage applied (Vmax) (Vp - Vmax) (V) | 5 | 5 | 5 |

TABLE 2

| | Variation ratio in gas flow direction (presence of auxiliary electrode/absence of auxiliary electrode) | Average photoelectric conversion efficiency ratio (presence of auxiliary electrode/absence of auxiliary electrode) | Average film formation rate ratio (presence of auxiliary electrode/absence of auxiliary electrode) |
|---|---|---|---|
| Experiment A | 0.667 | 1.12 | 1.06 |
| Experiment B | 0.117 | 1.25 | 1.10 |
| Experiment C | 0.711 | 1.05 | 1.04 |
| Experiment D | 0.592 | 1.14 | 1.09 |

What is claimed is:

1. A deposited-film formation method comprising the steps of:

providing a discharge electrode in a vacuum vessel equipped with exhaust means;

supplying a hydrogen gas and a raw material gas for forming a deposited film which contains at least an Si element;

generating plasma from the material gas by supplying high frequency electric power of 1 MHz to 200 MHz to the discharge electrode; and forming a deposited film on a substrate in the vacuum vessel by plasma CVD, wherein an auxiliary electrode electrically separate from said substrate is arranged in plasma spaced between the discharge electrode and the substrate in the vacuum vessel, and a periodically changing voltage having a voltage frequency of 1 MHz to 500 MHz and a maximum amplitude of 80V or less is applied to the auxiliary electrode, wherein a voltage lower than the potential of plasma is applied to the auxiliary electrode to avoid discharge and to form the deposited film while controlling generation of hydrogen radicals.

2. The deposited-film formation method according to claim 1, wherein the maximum amplitude of the voltage is 20 V to 80 V.

3. The deposited-film formation method according to claim 1, wherein the maximum amplitude of the voltage is 20 V to 60 V.

4. The deposited-film formation method according to claim 1, wherein when the periodically changing voltage is applied to the auxiliary electrode, a voltage lower than the potential of plasma from the material gas is applied only in a certain period in at least one cycle of the periodically changing voltage.

5. The deposited-film formation method according to claim 1, wherein a plurality of said auxiliary electrodes is arranged at least in a flow direction of the material gas.

6. The deposited-film formation method according to claim 1, wherein the auxiliary electrode is formed from an edgeless and small electrode having a small area facing a substrate in the vacuum vessel.

7. The deposited-film formation method according to claim 1, wherein the auxiliary electrode is formed from a round bar which has a small diameter and which is made of a high strength material of a high melting point metal.

8. A deposited-film formation method comprising the steps of:

providing a discharge electrode in a vacuum vessel equipped with exhaust means;

supplying a hydrogen gas and a raw material gas for forming a deposited film which contains at least an Si element;

generating plasma from the material gas by supplying high frequency electric power of 1 MHz to 200 MHz to the discharge electrode; and forming a deposited film on a substrate in the vacuum vessel by plasma CVD, wherein an auxiliary electrode electrically separate from said substrate is arranged in plasma spaced between the discharge electrode and the substrate in the vacuum vessel, a periodically changing voltage having a voltage frequency of 1 MHz to 500 MHz and a maximum amplitude of 80V or less is applied to the auxiliary electrode so that a voltage lower than the potential of plasma from the material gas is applied only in a certain period in at least one cycle of the periodically changing voltage to accelerate electrons at minimum voltage with minimal effect on the plasma, thereby forming the deposited film and controlling generation of hydrogen radicals.

9. A deposited-film formation method comprising the steps of:

providing a discharge electrode in a vacuum vessel equipped with exhaust means;

supplying a hydrogen gas and a raw material gas for forming a deposited film which contains at least an Si element;

generating plasma from the material gas by supplying high frequency electric power to the discharge electrode; and forming a deposited film on a substrate in the vacuum vessel by plasma CVD, wherein an auxiliary electrode electrically separate from said substrate is arranged in plasma spaced between the discharge electrode and the substrate in the vacuum vessel, a high-frequency power of 1 MHz to 200 MHz is applied to the discharge electrode, and a high-frequency power of 1 MHz to 500 MHz and a maximum amplitude of 80V or less is applied to the auxiliary electrode, wherein a voltage lower than the potential of plasma is applied to the auxiliary electrode to avoid discharge, thereby forming the deposited film and controlling generation of hydrogen radicals.

10. A deposited-film formation method comprising the steps of:

providing a discharge electrode in a vacuum vessel equipped with exhaust means;

supplying a hydrogen gas and a raw material gas for forming a deposited film which contains at least an Si element;

generating plasma from the material gas by supplying high frequency electric power of 1 MHz to 200 MHz to the discharge electrode; and forming a deposited film on a substrate in the vacuum vessel by plasma CVD, wherein an auxiliary electrode electrically separate from said substrate is arranged in plasma spaced between the discharge electrode and the substrate in the vacuum vessel, a periodic electric field having a voltage frequency of 1 MHz to 500 MHz and a maximum amplitude of 80V or less is applied to the auxiliary electrode, and only electrons are energized without energizing ions to discompose a hydrogen gas and generate hydrogen radicals to provide a voltage lower than the potential of plasma to avoid discharge, thereby forming the deposited film and controlling the generation of the hydrogen radicals.

* * * * *